United States Patent
Dhanasekaran

(10) Patent No.: US 9,326,073 B2
(45) Date of Patent: Apr. 26, 2016

(54) FM FILTERING FOR CLASS-G/H HEADPHONES

(71) Applicant: QUALCOMM Incorporated, San Diego, CA (US)

(72) Inventor: Vijayakumar Dhanasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 127 days.

(21) Appl. No.: 14/251,543

(22) Filed: Apr. 11, 2014

(65) Prior Publication Data

US 2015/0296300 A1    Oct. 15, 2015

(51) Int. Cl.
*H04R 5/033* (2006.01)
*H04R 5/04* (2006.01)
*H03G 3/20* (2006.01)
*H03F 3/181* (2006.01)
*H03F 1/02* (2006.01)
*H03F 3/21* (2006.01)

(52) U.S. Cl.
CPC .............. *H04R 5/033* (2013.01); *H03F 1/0227* (2013.01); *H03F 3/181* (2013.01); *H03F 3/21* (2013.01); *H03G 3/20* (2013.01); *H04R 5/04* (2013.01); *H04R 2420/05* (2013.01)

(58) Field of Classification Search
CPC ...... H04R 1/1041; H04R 3/00; H04R 1/1091; H04R 1/00; H04R 1/1025; H04R 1/02
USPC ........................................................ 381/309
See application file for complete search history.

(56) References Cited

U.S. PATENT DOCUMENTS

| 6,166,605 A | 12/2000 | Carver |
| 6,590,983 B1 * | 7/2003 | Kraemer ................ H04S 5/00 381/17 |
| 7,162,047 B2 * | 1/2007 | Yamada ................ H04S 1/005 381/309 |
| 7,733,178 B1 | 6/2010 | Delano et al. |

(Continued)

FOREIGN PATENT DOCUMENTS

| EP | 1718102 A1 | 11/2006 |
| GB | 2159017 A | 11/1985 |
| JP | S5723309 A | 2/1982 |

OTHER PUBLICATIONS

International Search Report and Written Opinion—PCT/US2015/021542—ISA/EPO—Jul. 6, 2015.

*Primary Examiner* — Mark Blouin
(74) *Attorney, Agent, or Firm* — Arent Fox LLP

(57) ABSTRACT

A radio frequency filtering circuit for audio headphones includes a switching power supply, audio amplifier section, one or more outputs from the audio amplifier section to one or more corresponding channels of the audio headphones, one or more L-C low pass filters arranged between the switching power supply and the audio amplifier section, and one or more L-C low pass filters arranged between the audio amplifier section and the one or more corresponding channels of the audio headphones. A method of filtering radio frequency signals for audio headphones includes providing an input voltage from a switching power supply section of a filtering circuit, passing the input voltage through an L-C low pass filter arranged between the switching power supply section and an audio amplifier section, and passing an output of the audio amplifier section through a second L-C low pass filter arranged between the audio amplifier section and an audio output to the headphones.

27 Claims, 3 Drawing Sheets

(56) References Cited

U.S. PATENT DOCUMENTS

| | | | |
|---|---|---|---|
| 8,208,654 B2 * | 6/2012 | Coutinho | G10K 11/1788 381/123 |
| 2006/0284673 A1 | 12/2006 | Peruzzi et al. | |
| 2011/0255698 A1 | 10/2011 | Young | |
| 2013/0223659 A1 | 8/2013 | Zhen et al. | |

* cited by examiner

FM FILTERING FOR CLASS-G/H HEADPHONES

BACKGROUND

1. Field

The present disclosure relates generally to noise filtering. More specifically the present disclosure relates to filtering in class-G/H amplifier circuits for headphones to avoid de-sensing/spurs of the FM receiver band.

2. Background

Headphones may be used in conjunction with wireless portable communication devices, as well as elsewhere. In a conventional headphone power amplifier system the coder-decoder (codec) charge-pump tones may fall in the FM band, which may need filtering to avoid de-sense of the FM receiver. A combination of ferrite beads (FB) plus capacitor offers low cost filtering. However, poor ferrite bead properties pose a difficult trade-off between high linearity audio reproduction and good FM reception. The filtering solution typically needs substantially sized components; however, very few ferrite beads in the market meet both audio and FM requirements.

There is a need to improve off chip filtering requirements for codec immunity to FM interference, reduce component size, and relax specifications for ferrite bead selection, i.e., to allow for greater flexibility in component sourcing.

SUMMARY

In an aspect of the disclosure, a radio frequency filtering circuit for audio headphones includes a switching power supply, an audio amplifier section, one or more outputs from the audio amplifier section to one or more corresponding channels of the audio headphones, one or more L-C low pass filters arranged between the switching power supply and the audio amplifier section, and one or more L-C low pass filters arranged between the audio amplifier section and the one or more corresponding channels of the audio headphones.

In a further aspect of the disclosure, a method of filtering radio frequency signals for audio headphones includes providing an input voltage from a switching power supply section of a filtering circuit, passing the input voltage through an L-C low pass filter arranged between the switching power supply section and an audio amplifier section, and passing an output of the audio amplifier section through a second L-C low pass filter arranged between the audio amplifier section and an audio output to the headphones.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
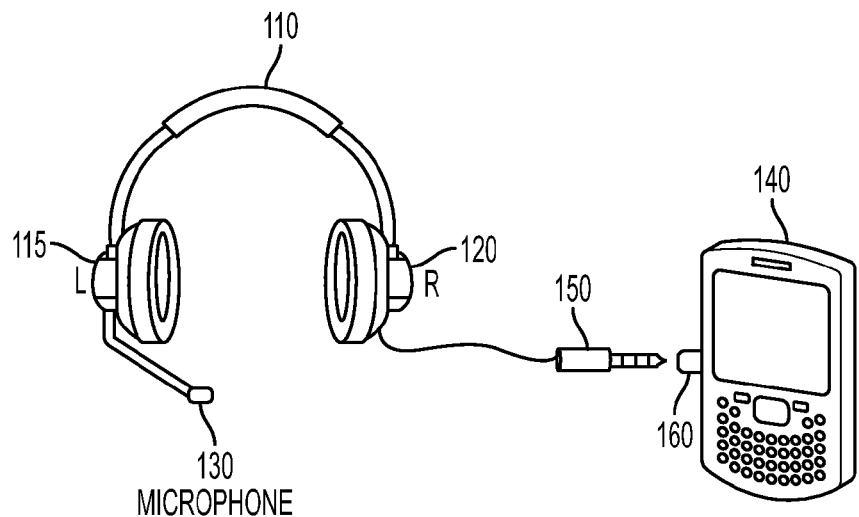
FIG. 1 illustrates a wireless device enabled to provide audio output to a stereo headphone.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

As used herein, the term "determining" encompasses a wide variety of actions and therefore, "determining" can include calculating, computing, processing, deriving, investigating, looking up (e.g., looking up in a table, a database or another data structure), ascertaining and the like. Also, "determining" can include resolving, selecting choosing, establishing, and the like.

The phrase "based on" does not mean "based only on," unless expressly specified otherwise. In other words, the phrase "based on" describes both "based only on" and "based at least on."

Moreover, the term "or" is intended to man an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The various illustrative logical blocks, modules, and circuits described in connection with the present disclosure may be implemented or performed with a general purpose processor, a digital signal processor (DSP), an application specific integrated circuit (ASIC), a field programmable gate array (FPGA), or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM, and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A computer-readable medium may be any available medium that can be accessed by a computer. By way of example, and not limitation, a computer-readable medium may comprise RAM, ROM, EEPROM, CD-ROM or other optical disk storage, magnetic disk storage, or other magnetic storage devices, or any other medium that can be used to carry or store desired program code in the form of instructions or data structures and that can be accessed by a computer. Disk and disc, as used herein, includes compact disk (CD), laser disk, optical disc, digital versatile disk (DVD), floppy disk, and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

Furthermore, various aspects are described herein in connection with a terminal, which can be a wired terminal or a wireless terminal. A terminal can also be called a system, device, subscriber unit, subscriber station, mobile station, mobile, mobile device, remote station, remote terminal, access terminal, user terminal, communication device, user agent, user device, or user equipment (UE). A wireless terminal may be a cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem. Moreover, various aspects are described herein in connection with a base station. A base station may be utilized for communicating with wireless terminal(s) and may also be referred to as an access point, a Node B, or some other terminology.

FIG. 1 illustrates a wireless device 140 enabled to provide audio output to a stereo headphone 110. The wireless device 140 may include, e.g., an MP3 player to provide the audio output. A plug 150 inserted into a jack 160 receives an electrical signal corresponding to left and right stereo audio output of the wireless device 140. Left and right channels of stereo audio are transduced at left earphone 115 and right earphone 120 to acoustic signals. A microphone 130 may be included to sense audio for transmission to the wireless device 140 through the plug 150 and jack 160.

The wireless device 140 may be, for example, a smart phone capable of receiving signals via standard wireless telecommunications channel, and may also be equipped to receive signals via wireless Internet channels, such as Wi-Fi, wide area network (WAN), local area network (LAN), or other wireless access point. In a further embodiment, the device 140 may not be a wireless device, but may be an MP3 player storing audio content provided by wired connection to a computer.

Figure 2:
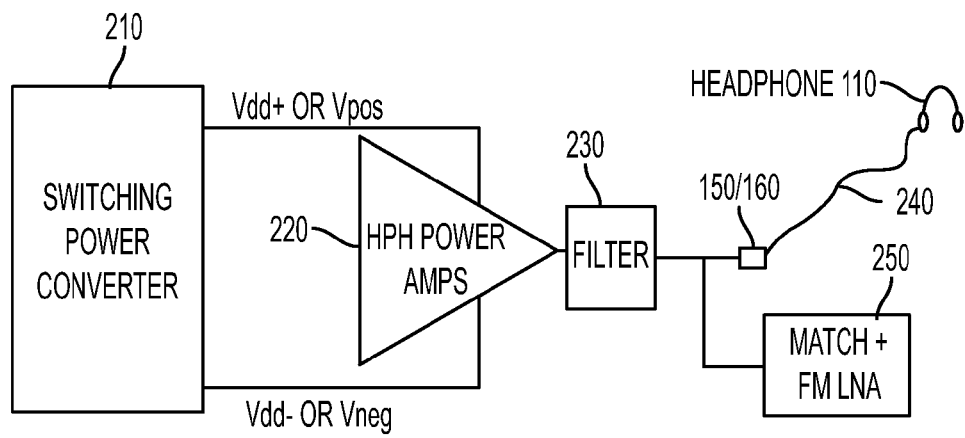
FIG. 2 illustrates aspects of a headphone power amplifier system in accordance with certain embodiments of the disclosure.

FIG. 2 illustrates aspects of a headphone power amplifier system coupled to the headphone 110, e.g., by the cable jack 150 to the plug 160 by way of a cable 240 between the jack 150 and the headphone 110. A switching power converter 210 may generate undesirable FM spurs which it is desirable to filter out. In an embodiment, the switching power converter 210 may provide a positive voltage Vdd+ or Vpos and a negative voltage Vdd− or Vneg to a headphone (HPH) power amplifier 220, which may include separate amplifiers (not shown) for each channel, e.g., for stereo, a left channel and a right channel. In the event that the headphone is capable of more channels (e.g., surround sound), there may be amplifiers for each channel. Each channel may be filtered to remove FM spurs using a filter 230, which may include a filter for each channel (not shown). Inductor-capacitor (L-C) T-filter design can achieve enough attenuation of out of band tones that falls in the FM band. Ferrite bead inductors can provide sufficient isolation and high attenuation in the FM band. However, such ferrite beads may be size #0603 to achieve high impedance and good linearity for audio signal, and therefore may be too large for headphone application.

The cable 240 may serve as an antenna for the wireless device 140. In this capacity, the cable 240 may be connected to a matching network 250 which may include a low noise amplifier to provide optimized power transfer from the antenna/cable 240 to an FM receiver input stage (not shown) of the wireless device 140.

Figure 3:
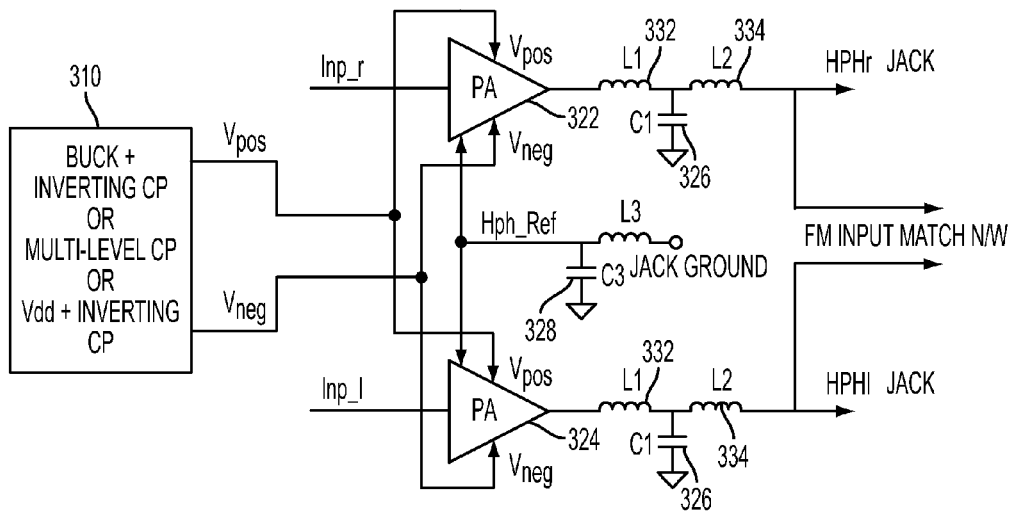
FIG. 3 illustrates a class-G/H amplifier including conventional L-C t-type filtering.

In a conventional configuration, as shown in FIG. 3, an L-C T-filter including two inductors 332, 334 arranged on either side of a capacitor 326 to ground, may achieve enough attenuation of out of band tones that falls in the FM band. A switching power supply 310 outputs, for example, voltages Vpos and Vneg. In a representative example, e.g., for stereo amplification and filtering, Vpos and Vneg are provided to two power amplifiers (e.g., operational amplifiers) $PA_r$ 322 and PA₁ 324 in parallel. PA_r receives an input analog signal Inp_r, and PA₁ receives an input analog signal Inp_1. Both PA_r 322 and PA₁ 324 have a common reference level Hph_Ref connected to the headphone plug 150 and jack 160 through a series inductor L3, with a capacitor C3 to ground. This simple L-C filter may be designed to pass audio frequencies while shunting high frequency FM spurs to ground.

The output of each power amplifier PA_r 322 and PA₁ 324 is passed through a T-type filter to the head phone right channel jack HPH_r and left channel jack HPH1, respectively. The T-type filter may include, for example, ferrite bead inductors L1 332 and L2 334 in series between the one of the power amplifiers PA_r 322/PA₁ 324 and the respective headphone channel jacks HPH_r/HPH1. A capacitor C1 326 to ground between L1 332 and L2 334 serves to shunt high frequency FM to ground for each headphone channel. The common reference level Hph_Ref may be connected to the headphone jack ground by a series ferrite bead inductor L3 and capacitor C3 328 to ground.

Ferrite inductor beads L2 334 provide isolation and high attenuation (L2=1000 ohms ferrite bead) of FM spurs from the headphone channels. The L2 334 beads may be 0603 size to achieve high impedance and good linearity for audio signal.

Figure 4:
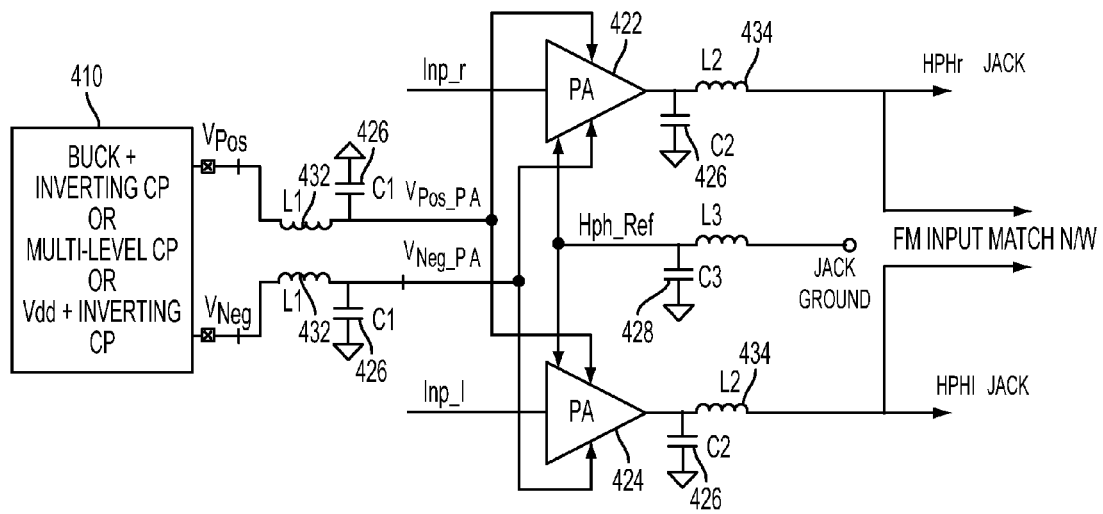
FIG. 4 illustrates a class-G/H amplifier including split L-C filtering in accordance with certain embodiments of the disclosure.

In an aspect of the disclosure, FIG. 4 illustrates an embodiment of a power amplifier system with split filtering for class-G/H Headphones. The filtering is now split between the supply path (left) and the signal path (right), i.e., a first portion of the filtering is between a switching power converter 410 and power amplifiers, and a second filtering portion is between the power amplifiers and the jacks connecting to respective channels of the headphone. For the sake of illustration, for a stereo headphone system, a right channel power amplifier PA_r 422 and a left channel power amplifier PA₁ 424 are shown. The high frequency attenuation filter is applied on the supply path. The supply path may include a bead inductor L1 432 in series and a capacitor C1 426 to ground between the inductor 432 and the power amplifier. Filters on the left and right channels, along with the Hph_Ref tap are implemented as LC filters with the capacitors C2 and C3 followed by inductors L2 and L3.

In one embodiment the L-C filter just described may be implemented only between Vpos and a positive bias port of each of the two power amplifiers PA_r 422 and PA' 424. In another embodiment the L-C filter just described may be implemented only between Vneg and a negative bias port of each of the two power amplifiers PA_r 422 and PA₁ 424. In yet another embodiment, the L-C filter just described may be implemented between both Vpos and the positive bias port of each of the two power amplifiers PA_r 422 and PA₁ 424, and between Vneg and the negative bias port of each of the two power amplifiers PA_r 422 and PA₁ 424.

Since a large capacitance C1 426 can be used in the supply path filter L1/C1, low impedance beads may be used—the signal path filter is limited by a maximum supported load capacitor (e.g., ~1 nF) that is less than the headset capacitor. Since the supply path is tolerant to non-linearity, the bead low frequency non-linearity is not a concern for audio performance. As a result, the supply filter's ferrite bead requirement can be greatly relaxed. This may allow reduction of the ferrite bead size and more manufacturer selection choice.

Figure 5:
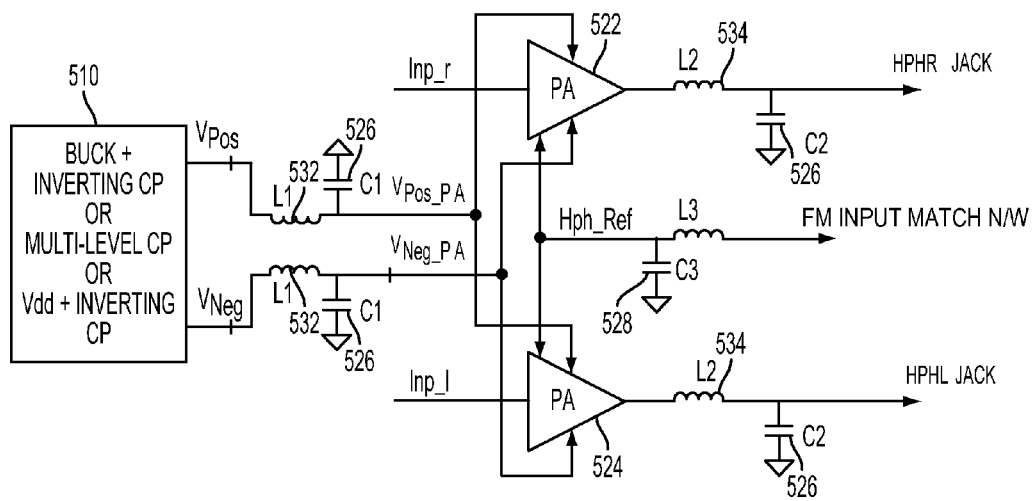
FIG. 5 illustrates a class-G/H amplifier including split L-C filtering in accordance with certain other embodiments of the disclosure.

In an aspect of the disclosure, FIG. 5 illustrates another embodiment of a power amplifier system with split filtering for class-G/H Headphones. As in FIG. 4, the filtering is split between the supply path (left) and the signal path (right), i.e., a first portion of the filtering is between a switching power converter 510 and power amplifiers, and a second filtering portion is between the power amplifiers and the jacks connecting to respective channels of the headphone. For the sake of illustration, for a stereo headphone system, a right channel power amplifier PA_r 522 and a left channel power amplifier PA₁ 524 are shown. The high frequency attenuation filter is applied on the supply path. The supply path may include a bead inductor L1 532 in series and a capacitor C1 526 to ground between the inductor 532 and the power amplifier.

In one embodiment the L-C filter just described may be implemented only between Vpos and a positive bias port of each of the two power amplifiers PA_r 422 and PA' 424. In another embodiment the L-C filter just described may be implemented only between Vneg and a negative bias port of each of the two power amplifiers PA_r 522 and PA' 524. In yet another embodiment, the L-C filter just described may be implemented between both Vpos and the positive bias port of each of the two power amplifiers PA_r 522 and PA' 524, and between Vneg and the negative bias port of each of the two power amplifiers PA_r 522 and PA' 524.

Unlike the embodiment of FIG. 4, the LC filter on each channel comprises the inductor 534 coupled to the output of the amplifier 524 followed by capacitor 526. The Hph_Ref tap is coupled through an LC filter comprising capacitor 528 coupled through inductor L3 providing FM INPUT MATCH N/W. It should be noted that capacitors C2 526 can also be on the other side of inductors L2 if desired.

Since a large capacitance C1 526 can be used in the supply path filter L1/C1, low impedance beads may be used—the signal path filter is limited by a maximum supported load capacitor (e.g., ~1 nF) that is less than the headset capacitor. Since the supply path is tolerant to non-linearity, the bead low frequency non-linearity is not a concern for audio performance. As a result, the supply filter's ferrite bead requirement can be greatly relaxed. This may allow reduction of the ferrite bead size and more manufacturer selection choice.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A radio frequency filtering circuit for audio headphones comprising:
   a switching power supply having a positive voltage terminal (Vpos) and a negative voltage terminal (Vneg);
   an audio amplifier section coupled to the switching power supply;
   one or more outputs from the audio amplifier section to one or more corresponding channels of the audio headphones;
   an L-C low pass filter arranged between the positive voltage terminal (Vpos) and the audio amplifier section;
   an L-C low pass filter arranged between the negative voltage terminal (Vneg) and the audio amplifier section; and
   one or more L-C low pass filters arranged between the one or more outputs of the audio amplifier section and the one or more corresponding channels of the audio headphones.

2. The circuit of claim 1, wherein the switching power supply is at least one or a combination of buck converter, inverting charge pump, multi-level charge pump, buck-boost converter and a flyback converter.

3. The circuit of claim 1, wherein the audio amplifier section comprises:
   a left stereo channel power amplifier having a positive voltage terminal Vpos_LPA and a negative voltage terminal Vneg_LPA coupled respectively to the Vpos and Vneg terminals of the switching power supply;
   a right stereo channel power amplifier having a positive voltage terminal Vpos_RPA and a negative voltage terminal Vneg_RPA coupled respectively to the Vpos and Vneg terminals of the switching power supply; and
   an audio output from each of the respective left stereo channel power amplifier and the right stereo channel power amplifier.

4. The circuit of claim 3, wherein the one or more L-C filters arranged between the switching power supply and the audio amplifier section comprise:
   a first bead inductor arranged in series between Vpos and a connection comprising Vpos_LPA; and
   a second bead inductor arranged in series between Vneg and a connection comprising Vneg_LPA.

5. The circuit of claim 4, further comprising:
   a first capacitor coupled to a circuit common ground arranged between the first bead inductor and the connection comprising Vpos_LPA; and
   a second capacitor coupled to a circuit common ground arranged between the second bead inductor and the connection comprising Vneg_LPA.

6. The circuit of claim 3, wherein the one or more L-C low pass filters arranged between the audio amplifier section and the one or more corresponding outputs of the left stereo channel power amplifier and the right stereo channel power amplifier of the audio headphones comprise:
   a first bead inductor arranged in series between an output of the left stereo channel power amplifier and a jack for a left channel of the audio headphone; and
   a second bead inductor arranged in series between an output of the right stereo channel power amplifier and a jack for a right channel of the audio headphone.

7. The circuit of claim 6, further comprising:
   a first capacitor coupled to a circuit common ground and arranged between the first bead inductor and the output of the left stereo channel power amplifier; and
   a second capacitor coupled to a circuit common ground and arranged between the second bead inductor and the output of the right stereo channel power amplifier.

8. The circuit of claim 3, further comprising an inductor arranged in series between a common headphone reference level pin output of the left and right stereo channel power amplifiers and a headphone jack ground pin.

9. The circuit of claim 8, further comprising a capacitor connected between the common headphone reference level pin input of the left and right stereo channel power amplifiers and the circuit common ground.

10. A radio frequency filtering circuit for audio headphones comprising:
    a switching power supply having a positive voltage terminal (Vpos) and a negative voltage terminal (Vneg);
    an audio amplifier section coupled to the switching power supply;
    one or more outputs from the audio amplifier section to one or more corresponding channels of the audio headphones;
    an L-C low pass filter arranged between the positive voltage terminal (Vpos) and the audio amplifier section; and
    one or more L-C low pass filters arranged between the one or more outputs of the audio amplifier section and the one or more corresponding channels of the audio headphones.

11. The circuit of claim 10, wherein the switching power supply is at least one or a combination of buck converter, inverting charge pump, multi-level charge pump, buck-boost converter and a flyback converter.

12. The circuit of claim 10, wherein the audio amplifier section comprises:
    a left stereo channel power amplifier having a positive voltage terminal Vpos_PA and a negative voltage terminal Vneg_PA coupled respectively to the Vpos and Vneg terminals of the switching power supply;
    a right stereo channel power amplifier having a positive voltage terminal Vpos_PA and a negative voltage terminal Vneg_PA coupled respectively to the Vpos and Vneg terminals of the switching power supply; and
    an audio output from each of the respective left stereo channel power amplifier and the right stereo channel power amplifier.

13. The circuit of claim 12, wherein the one or more L-C filters arranged between the switching power supply comprise:
    a bead inductor arranged between Vpos and Vpos_PA.

14. The circuit of claim 13, further comprising:
    a capacitor coupled to a circuit common ground arranged between the first bead inductor and Vpos_PA.

15. The circuit of claim 12, wherein the one or more L-C low pass filters arranged between the audio amplifier section and the one or more corresponding outputs of the left stereo channel power amplifier and the right stereo channel power amplifier of the audio headphones comprise:
    a first bead inductor arranged in series between an output of the left stereo channel power amplifier and a jack for a left channel of the audio headphone; and
    a second bead inductor arranged in series between an output of the right stereo channel power amplifier and a jack for a right channel of the audio headphone.

16. The circuit of claim 15, further comprising:
    a first capacitor coupled to a circuit common ground arranged between the first bead inductor and the jack for the left channel of the audio headphone; and a second capacitor coupled to a circuit common ground arranged between the second bead inductor and the jack for the right channel of the audio headphone.

17. The circuit of claim 16, further comprising an inductor arranged in series between a common headphone reference level pin output of the left and right stereo channel power amplifiers and a headphone jack ground pin.

18. The circuit of claim 17, further comprising a capacitor to a circuit common ground arranged between the common headphone reference level pin output of the left and right stereo channel power amplifiers and the headphone jack ground pin.

19. A radio frequency filtering circuit for audio headphones comprising:
   a switching power supply having a positive voltage terminal (Vpos) and a negative voltage terminal (Vneg);
   an audio amplifier section coupled to the switching power supply;
   one or more outputs from the audio amplifier section to one or more corresponding channels of the audio headphones;
   an L-C low pass filter arranged between the negative voltage terminal (Vneg) and the audio amplifier section; and
   one or more L-C low pass filters arranged between the one or more outputs of the audio amplifier section and the one or more corresponding channels of the audio headphones.

20. The circuit of claim 19, wherein the switching power supply is at least one or a combination of buck converter, inverting charge pump, multi-level charge pump, buck-boost converter and a flyback converter.

21. The circuit of claim 20, wherein the audio amplifier section comprises:
   a left stereo channel power amplifier having a positive voltage terminal Vpos_PA and a negative voltage terminal Vneg_PA coupled respectively to the Vpos and Vneg terminals of the switching power supply;
   a right stereo channel power amplifier having a positive voltage terminal Vpos_PA and a negative voltage terminal Vneg_PA coupled respectively to the Vpos and Vneg terminals of the switching power supply; and
   an audio output from each of the respective left stereo channel power amplifier and the right stereo channel power amplifier.

22. The circuit of claim 21, wherein the one or more L-C filters arranged between the switching power supply comprise:
   a bead inductor L1 arranged between Vneg and Vneg_PA.

23. The circuit of claim 22, further comprising:
   a capacitor C1 coupled to a circuit common ground arranged between the first bead inductor L1 and Vneg_PA.

24. The circuit of claim 21, wherein the one or more L-C low pass filters arranged between the audio amplifier section and the one or more corresponding outputs of the left stereo channel power amplifier and the right stereo channel power amplifier of the audio headphones comprise:
   a first bead inductor arranged in series between an output of the left stereo channel power amplifier and a jack for a left channel of the audio headphone; and
   a second bead inductor arranged in series between an output of the right stereo channel power amplifier and a jack for a right channel of the audio headphone.

25. The circuit of claim 24, further comprising:
   a first capacitor coupled to a circuit common ground arranged between the first bead inductor and the jack for the left channel of the audio headphone; and
   a second capacitor coupled to a circuit common ground arranged between the second bead inductor and the jack for the right channel of the audio headphone.

26. The circuit of claim 21, further comprising an inductor arranged in series between a common headphone reference level pin output of the left and right stereo channel power amplifiers and a headphone jack ground pin.

27. The circuit of claim 26, further comprising a capacitor to a circuit common ground arranged between the common headphone reference level pin output of the left and right stereo channel power amplifiers and the headphone jack ground pin.

* * * * *